(12) United States Patent
Yun

(10) Patent No.: US 6,934,895 B2
(45) Date of Patent: Aug. 23, 2005

(54) I/O COMPRESSION CIRCUIT FOR A SEMICONDUCTOR MEMORY DEVICE

(75) Inventor: Joon Yul Yun, Seoul (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 465 days.

(21) Appl. No.: 10/134,812

(22) Filed: Apr. 29, 2002

(65) Prior Publication Data

US 2003/0110425 A1 Jun. 12, 2003

(30) Foreign Application Priority Data

Dec. 10, 2001 (KR) .................................... 2001-0077853

(51) Int. Cl.[7] .............................................. G11C 29/00
(52) U.S. Cl. ........................ 714/718; 714/718; 714/719; 714/726; 365/200; 365/201; 365/189.01; 365/230.01; 365/230.03; 324/765; 324/819; 324/820
(58) Field of Search ................................ 714/718, 719, 714/726, 738; 365/200, 201, 189.01, 2, 230.01, 230.03; 324/765, 819, 820

(56) References Cited

U.S. PATENT DOCUMENTS

| 5,864,510 | A | | 1/1999 | Nakaoka |
| 6,009,026 | A | * | 12/1999 | Tamlyn et al. ............... 365/201 |
| 6,357,027 | B1 | * | 3/2002 | Frankowsky ................. 714/738 |
| 6,452,845 | B1 | * | 9/2002 | Merritt ........................ 365/201 |

FOREIGN PATENT DOCUMENTS

JP          7-85699          3/1995

OTHER PUBLICATIONS

Notice of Rejection from Korean Intellectual Property Office dated Dec. 8, 2003 (4 pages).

* cited by examiner

Primary Examiner—Ayaz Sheikh
(74) Attorney, Agent, or Firm—Marshall, Gerstein & Borun LLP

(57) ABSTRACT

An I/O compression circuit for a semiconductor memory device operates in a same data compress mode to transmit identical data to all compressed data buses and a different data compress mode to transmit different data to adjacent compressed data buses.

11 Claims, 6 Drawing Sheets

I/O COMPRESSION CIRCUIT FOR A SEMICONDUCTOR MEMORY DEVICE

BACKGROUND OF THE INVENTION

1. Field of the Invention

The present invention relates generally to an I/O compression circuit for a semiconductor memory device and, more particularly, to an I/O compression circuit that reduces the number of I/O data pins and time required for testing the memory device.

2. Description of the Background Art

In testing a semiconductor memory device, a test time is dependent upon the number of chips that can be tested at one time. The test time can be reduced by decreasing a number of I/O data pins used in the test. Therefore, a compression device that transmits data to a plurality of internal data buses through one external I/O data pin is typically employed.

In a conventional I/O compressor for a semiconductor memory device, one data signal is identically transmitted to a plurality of transmission lines through a single I/O data pin.

When performing a test that writes the same or identical data on adjacent data buses, data signals input to one I/O data pin are identically transmitted to a plurality of adjacent data buses through the compressor (i.e., the same data is transmitted via the adjacent data buses).

However, when for performing a test that writes different data on adjacent data buses, the different data are written on separate I/O data pins corresponding to the data buses, without using the compressor for the test. As a result, a large number of I/O data pins are required and the data write time and, thus, the total time for the test is increased.

SUMMARY OF THE INVENTION

An I/O compression circuit for a semiconductor memory device may include a command decoder for combining external control signals and outputting a test mode command, a test mode control unit for generating a compress signal to control a compression operation and a compress mode signal for distinguishing a compression mode in which the same data are transmitted to data buses from a compression mode in which different data are transmitted to adjacent data buses, a mode decoder for decoding the compress signal and the compress mode signal and outputting a same compress signal for controlling the compression operation in a same data compress mode and a different compress signal for controlling the compression operation in a different data compress mode. The I/O compression circuit may also include an input unit for decoding the data inputted via I/O data pins and transmitting the data to data transmission lines in a normal mode, transmitting the same data inputted via the I/O data pins to the data transmission lines in the same data compression mode of the test mode, and alternately inverting the data inputted via the I/O data pins to transmit different data to the adjacent data transmission lines in the different data compression mode according to the compress signal, the same compress signal and the different compress signal. Additionally, the I/O compression circuit may include an output unit for driving the data transmitted through the data transmission lines and outputting the data to the I/O data pins in the normal mode, testing the data transmitted through the data transmission lines in the same data compression mode of the test mode according to the compress signal and the compress mode signal, and re-inverting the inverted data among the data transmitted through the data transmission lines, and testing the data in the different data compress mode.

DETAILED DESCRIPTION OF THE PREFERRED EMBODIMENTS

Figure 1:
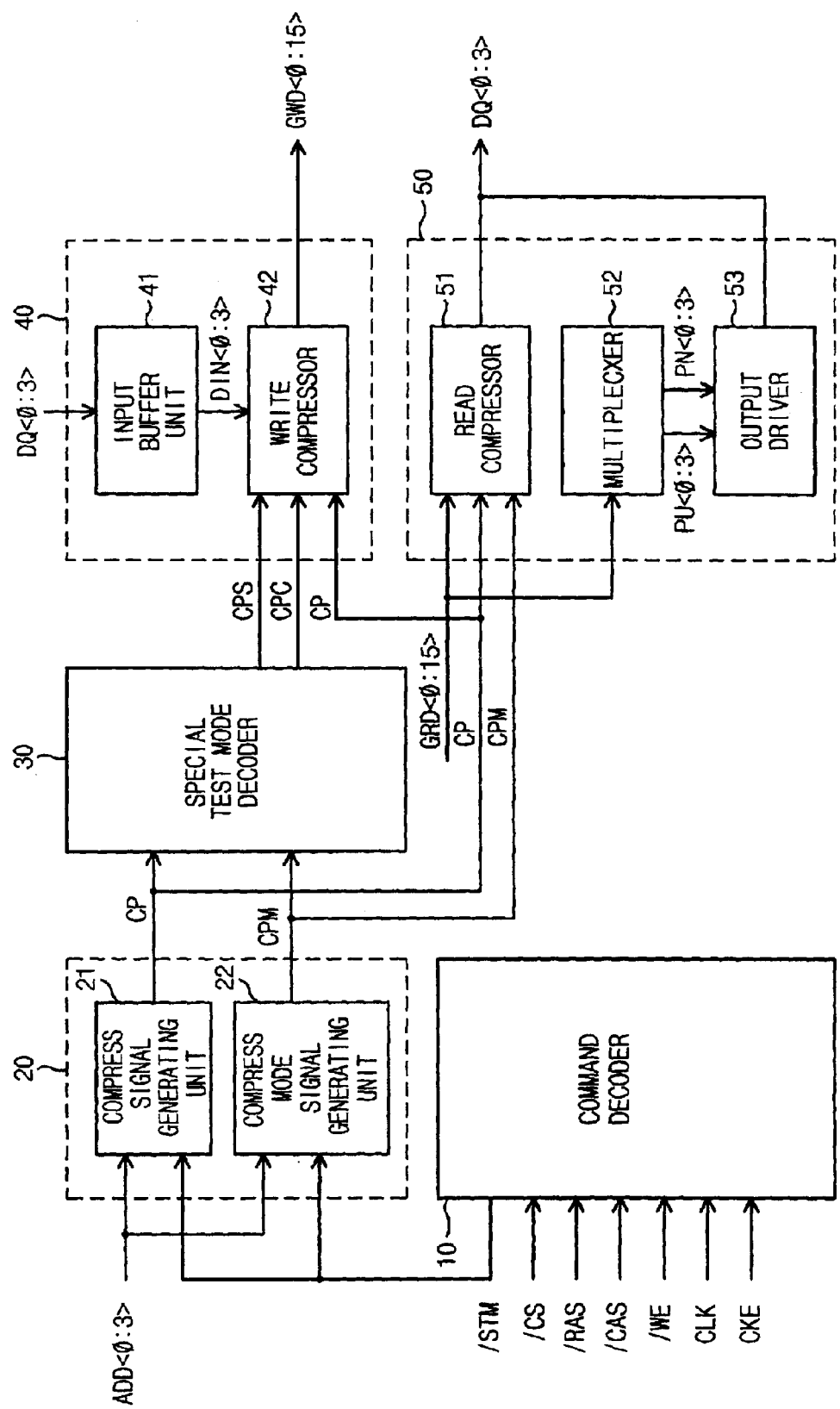
FIG. 1 is an exemplary block diagram illustrating an I/O compression circuit for a semiconductor memory device.

FIG. 1 is an exemplary block diagram illustrating an I/O compression circuit that may be used within a semiconductor memory device. The I/O compression circuit includes a command decoder 10 for outputting a special test mode command "/STM," a special test mode code register 20, a special test mode decoder 30, an input unit 40 for transmitting data DIN<0:3> input via I/O data pins DQ0–DQ3 to global write data buses GWD<0:15>, and an output unit 50 for outputting data of global read data buses GRD<0:15> via the I/O data pins DQ0–DQ3.

The command decoder 10 combines external control signals /CS, /RAS, /CAS, /WE, CLK and CKE, and outputs the special test mode command /STM. The special test mode code register 20 generates a compress signal CP for controlling a compress operation. The special test mode register 20 also outputs a compress mode signal CPM, which is indicative of compress modes according to the special test mode command /STM and addresses ADD<0:3>. The compress modes may be classified as either a case in which same or identical data are transmitted to data buses or a case in which different data are transmitted to adjacent data buses.

The special test mode decoder 30 decodes the compress signal CP and the compress mode signal CPM. Then, it outputs a "same" compress signal CPS and a "different" compress signal CPC. The same compress signal CPS controls the compress operation when the same data are transmitted to adjacent data transmission lines. The different compress signal CPC controls the compress operation when different data are transmitted to adjacent data transmission lines.

The input unit 40 includes an input buffer unit 41 for buffering the data input via the I/O data pins DQ<0:3> and outputting the buffered data. The input unit 40 also includes a write compressor 42 for transmitting the buffered data DIN<0:3> of the input buffer unit 41 to the global write data buses GWD<0:15> in a normal mode, and compressing the buffered data DIN<0:3> of the input buffer unit 41 and transmitting the compressed data to the global write data buses GWD<0:15> in a test mode according to the compress signal CP, the same compress signal CPS and the different compress signal CPC.

The output unit 50 includes a multiplexer 52 for receiving data through the global read data buses GRD<0:15> and outputting driving signals PU<0:3> and PN<0:3>, an output driver unit 53 for outputting the data transmitted via the multiplexer 52 to the I/O data pins DQ<0:3> in the normal mode, and a read compressor 51 for comparing the data transmitted through the global read data buses GRD<0:15>, and outputting the data to the representative I/O data pin DQ<0> after compression in the test mode.

Figure 2A:
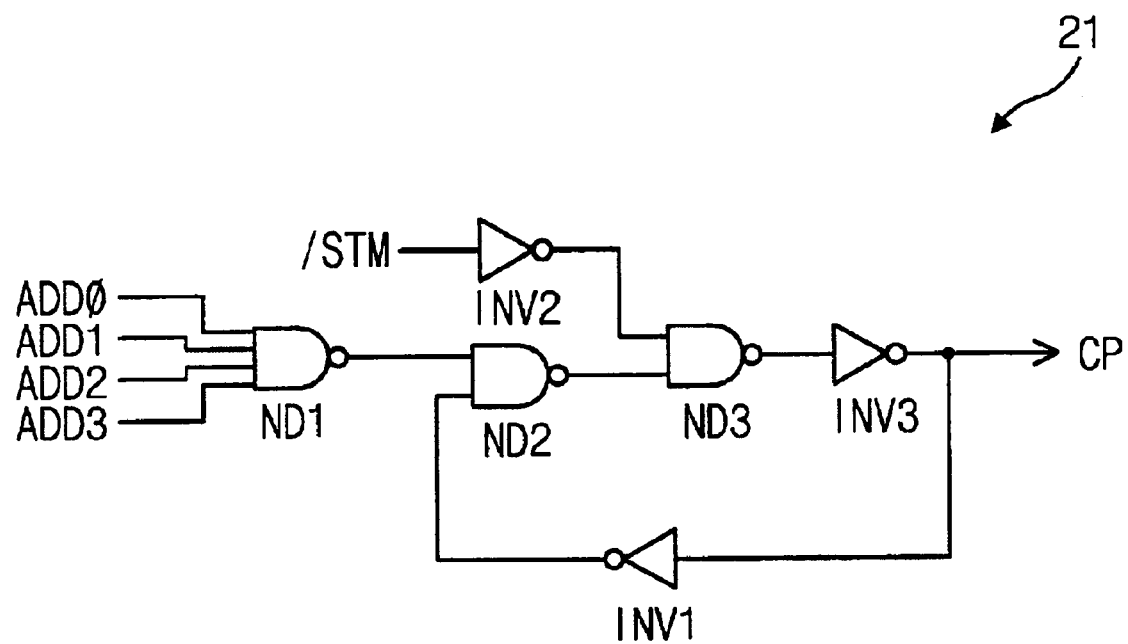
FIG. 2a is an exemplary detailed circuit diagram illustrating the compress signal generating unit shown in FIG. 1.

FIG. 2a is an exemplary detailed circuit diagram illustrating the compress signal generating unit 21 of the special test mode code register 20 for outputting the compress signal CP. The compress signal generating unit 21 includes a NAND gate ND1 for NANDing the address lines ADD<0:3>, an inverter INV1 for inverting the compress signal CP, a NAND gate ND2 for NANDing the output signal from the NAND gate ND1 and the output signal from the inverter INV1. The compression signal generating unit 21 also includes inverter INV2 for inverting the special test mode command /STM, a NAND gate ND3 for NANDing the output signal from the NAND gate ND2 and the output signal from the inverter INV2, and an inverter INV3 for inverting the output signal from the NAND gate ND3 and outputting the compress signal CP.

Figure 2B:
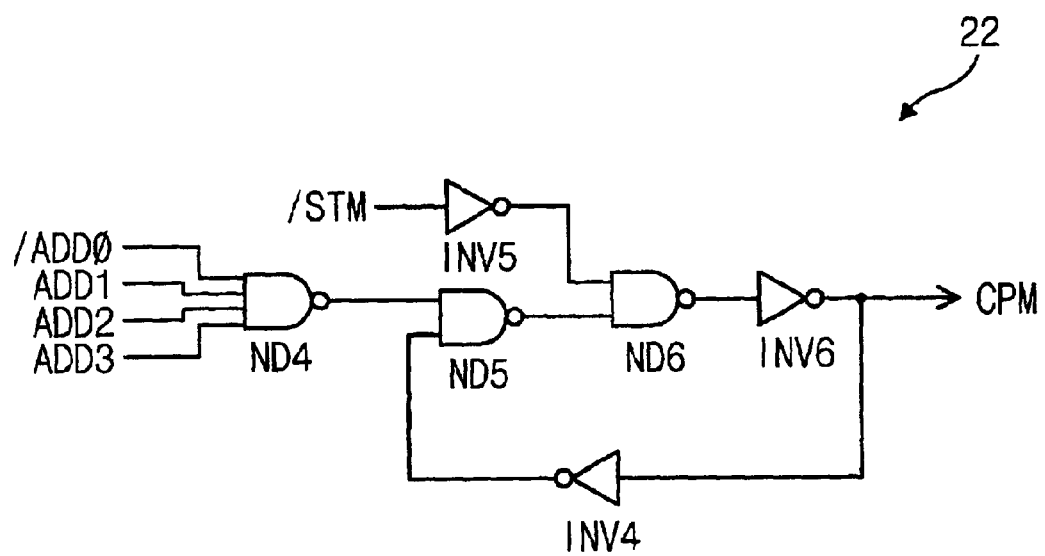
FIG. 2b is an exemplary detailed circuit diagram illustrating a compress mode signal generating unit shown in FIG. 1.

FIG. 2b is an exemplary detailed circuit diagram illustrating the compress mode signal generating unit 22 of the special test mode code register 20 shown in FIG. 1. The compress mode signal generating unit 22 of the special test mode code register 20 includes a NAND gate ND4 for NANDing an inverted address /ADD<0> and other addresses ADD<1:3>, an inverter INV4 for inverting the compress mode signal CPM, a NAND gate ND5 for NANDing the output signal from the NAND gate ND4 and the output signal from the inverter INV4, an inverter INV5 for inverting the special test mode command /STM, a NAND gate ND6 for NANDing the output signal from the NAND gate ND5 and the output signal from the inverter INV5, and an inverter INV6 for inverting the output signal from the NAND gate ND6 and outputting the compress mode signal CPM.

Figure 3:
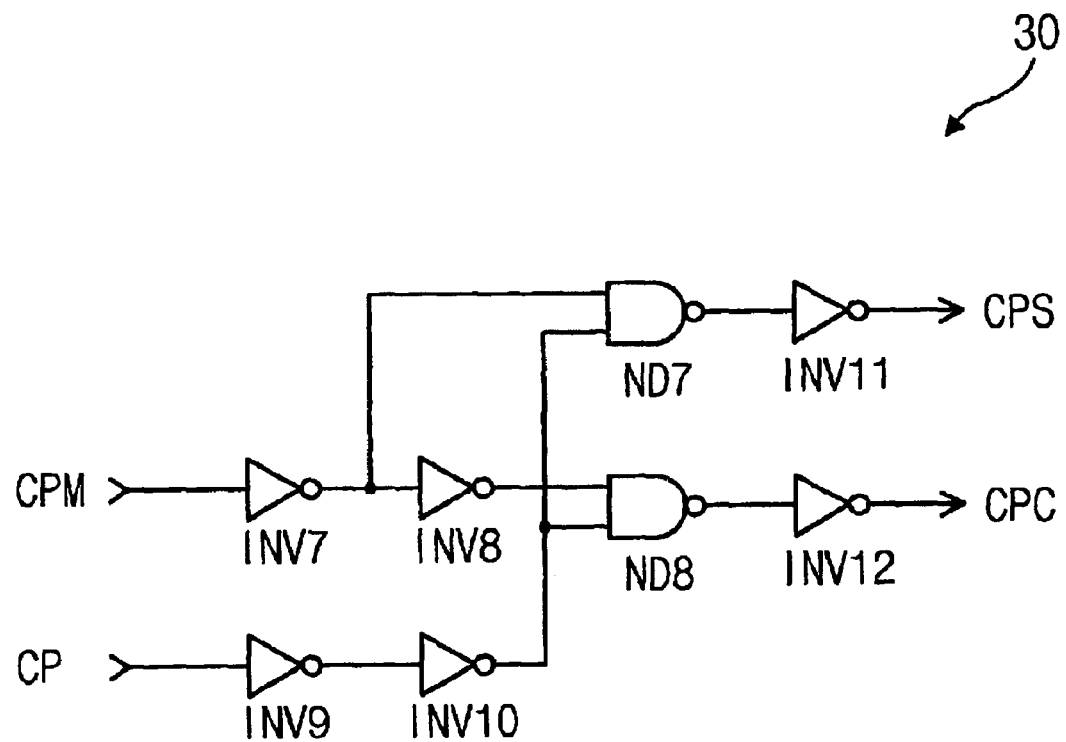
FIG. 3 is an exemplary detailed circuit diagram illustrating the special test mode decoder shown in FIG. 1.

FIG. 3 is an exemplary detailed circuit diagram illustrating the special test mode decoder 30 shown in FIG. 1. The special test mode decoder 30 includes: inverters INV7 and INV8 for sequentially inverting the compress mode signal CPM, inverters INV9 and INV10 for sequentially inverting the compress signal CP, a NAND gate ND7 for NANDing the output signal from the inverter INV7 and the output signal from the inverter INV10, a NAND gate ND8 for NANDing the output signal from the inverter INV8 and the output signal from the inverter INV10, an inverter INV11 for inverting the output signal from the NAND gate ND7, and outputting the same compress mode signal CPS, and an inverter INV12 for inverting the output signal from the NAND gate ND8 and outputting the different compress mode signal CPC. Thus, the special test mode decoder 30 generates the same compress mode signal CPS for transmitting the same data to the adjacent data buses, and the different compress mode signal CPC for transmitting the different data to the adjacent data buses according to the compress mode signal CPM in the special test mode.

Figure 4:
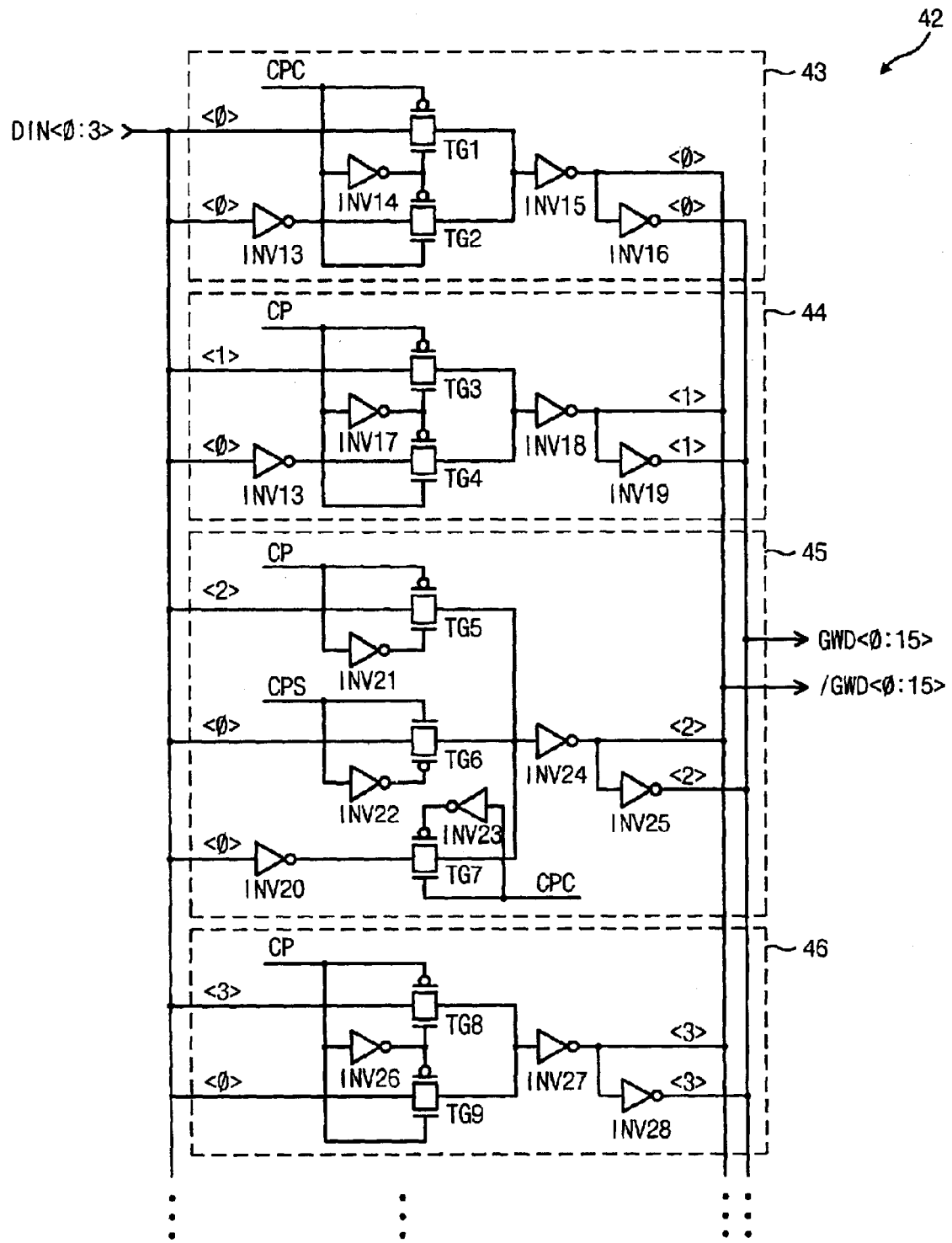
FIG. 4 is an exemplary detailed circuit diagram illustrating the write compressor shown in FIG. 1.

FIG. 4 is an exemplary detailed circuit diagram illustrating the write compressor 42 of the input unit 40. The write compressor 42 of the input unit 40 distinguishes the normal mode from the test mode and divides the test mode into the "same data" compress mode and the "different data" compress mode. The write compressor 42 sets up different transmission paths in the normal mode, the same data compress mode and the different data compress mode, and transmits the buffered data DIN<0:3> from the input buffer unit 41 to the global write data buses GWD<0:15>.

The write compressor 42 includes four unit compressors for decoding the buffered data DIN<0:3> and transmitting the decoded data to the global write data buses GWD<0:15> in the normal mode, and for compressing the test data DIN<0> and transmitting the compressed data to the global write data buses GWD<0:15> in the test mode.

The first unit compressor includes four transmission units 43–46. The first transmission unit 43 includes transmission gates TG1 and TG2 controlled according to the different compress mode signal CPC and the signal inverted by an inverter INV14, for selectively transmitting the data DIN<0> input via the input buffer unit 41 and the data /DIN<0> inverted by an inverter INV13 an inverter INV15 for inverting the data DIN<0> or /DIN<0> selectively transmitted by the transmission gates TG1 and TG2 and transmitting the inverted data to an inversion global write data bus /GWD<0>, and an inverter INV16 for inverting the output data from the inverter INV15, and transmitting the inverted data to the global write data bus GWD<0>.

The second transmission unit 44 includes transmission gates TG3 and TG4 controlled according to the compress signal CP and the signal inverted by an inverter INV17, for selectively transmitting the data DIN<1> and DIN<0> inputted via the input buffer unit 41, an inverter INV18 for inverting the data DIN<1> or DIN<0> selectively transmitted by the transmission gates TG3 and TG4 and transmitting the inverted data to an inversion global write data bus /GWD<1>, and an inverter INV19 for inverting the output data from the inverter INV18 and transmitting the inverted data to the global write data bus GWD<1>.

The third transmission unit 45 includes a transmission gate TG5 controlled according to the compress signal CP and the signal inverted by an inverter INV21, for selectively transmitting the data DIN<2> inputted via the input buffer unit 41 a transmission gate TG6 controlled according to the same compress signal CPS and the signal inverted by an inverter INV22 for selectively transmitting the data DIN<0> inputted via the input buffer unit 41 a transmission gate TG7 controlled according to the different compress signal CPC and the signal inverted by an inverter INV23 for selectively transmitting the data /DIN<0> inverted by an inverter INV20, an inverter INV24 for inverting the data selectively transmitted by the transmission gates TG5, TG6 and TG7 and transmitting the inverted data to an inversion global write data bus /GWD<2>, and an inverter INV25 for inverting the output data from the inverter INV24 and transmitting the inverted data to the global write data bus GWD<2>.

The fourth transmission unit 46 includes transmission gates TG8 and TG9 controlled according to the compress signal CP and the signal inverted by an inverter INV26, for selectively transmitting the data DIN<3> and DIN<0> inputted via the input buffer unit 41, an inverter INV27 for inverting the data DIN<3> or DIN<0> selectively transmitted by the transmission gates TG8 and TG9 and transmitting the inverted data to an inversion global write data bus /GWD<3> and an inverter INV28 for inverting the output data from the inverter INV27 and transmitting the inverted data to the global write data bus GWD<3>.

In the normal mode, the write compressor 42 of the input unit 40 decodes the data input via the data input pins DQ<0:3> and transmits the decoded data to the global write data buses GWD<0:15>. In the test mode, when receiving the different compress mode signal CPC, the write compressor 42 alternately inverts the test data DIN<0> input via one data input pin DQ<0> and sets up the transmission path to transmit the different data to the adjacent global write data buses GWD<0:15>. When receiving the same compress mode signal CPS, the write compressor 42 sets up the transmission path to transmit the same data to the global write data buses GWD<0:15>.

Figure 5:
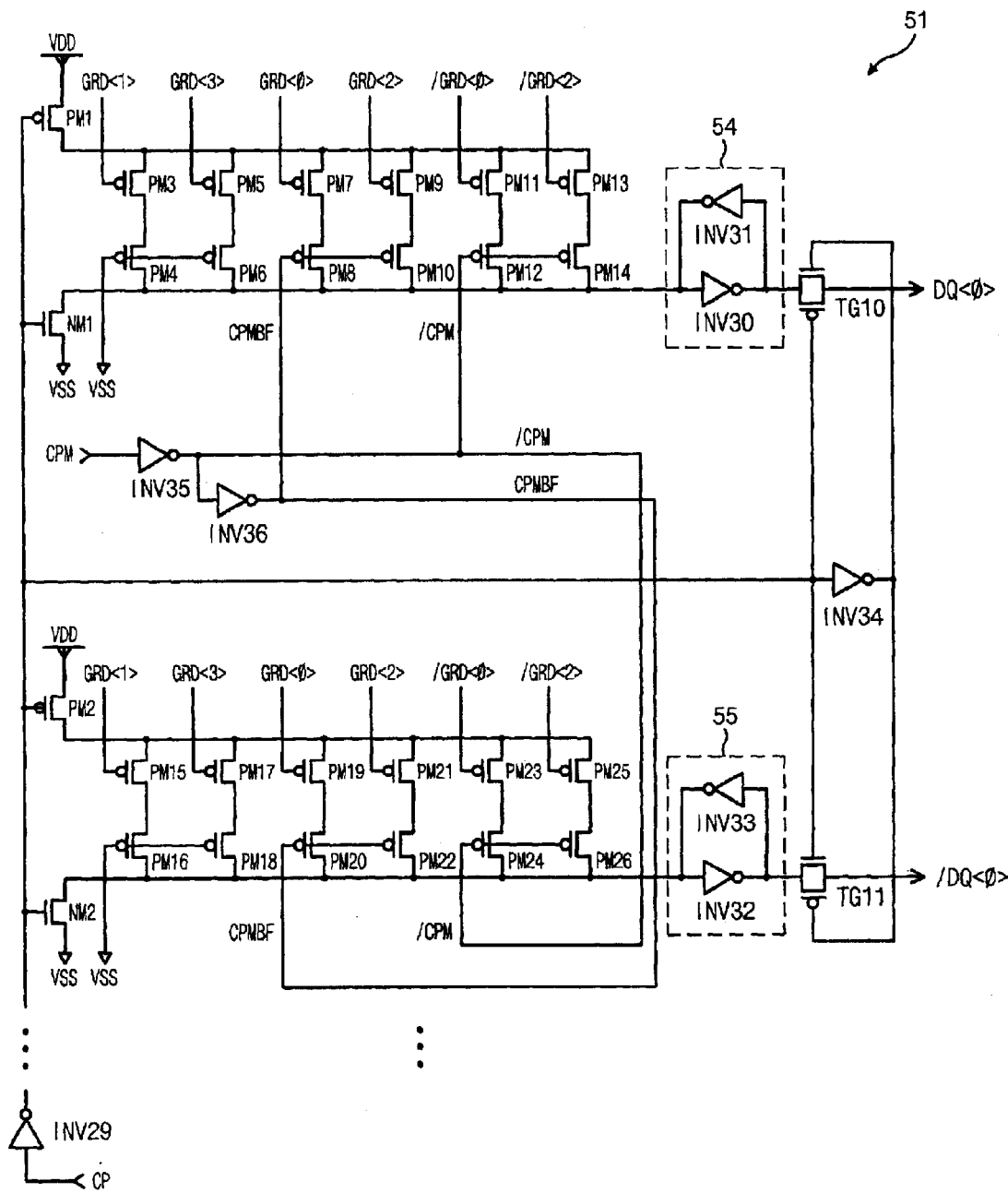
FIG. 5 is an exemplary detailed circuit diagram illustrating the read compressor shown in FIG. 1.

FIG. 5 is an exemplary detailed circuit diagram illustrating the read compressor 51 of the output unit 50 shown in FIG. 1. The read compressor 51 of the output unit 50 includes PMOS transistors PM1 and PM2, which have gate terminals that are connected to receive an inverted signal of the compress signal CP via an inverter INV29, and source terminals connected to receive the power voltage VDD. The read compressor 51 also includes NMOS transistors NM1 and NM2 which have source terminals that are connected to receive the ground voltage VSS PMOS transistors PM3–PM14 connected as shown in FIG. 5, a latch unit 54 having two inverters INV30 and INV31 for latching a voltage of the drain of the NMOS transistor NM1 a transmission gate TG10 controlled according to the compress signal CP and the signal inverted by an inverter INV34 to selectively transmit the data latched by the latch unit 54 to the I/O data pin DQ<0>. Additionally the read compressor 51 includes PMOS transistors PM15–PM26 connected in series and connected in parallel between the drain of the PMOS transistor PM2 and the drain of the NMOS transistor NM2 as shown in FIG. 5, a latch unit 55 having two inverters INV32 and INV33 for latching a voltage of the drain of the NMOS transistor NM2, and a transmission gate TG11 controlled according to the compress signal CP and the signal inverted by an inverter INV34 to selectively transmit the data latched by the latch unit 55 to the I/O data pin DQ<0>.

The global read data bus GRD<1> and the ground voltage VSS are connected to respective gates of the PMOS transistors PM3 and PM4. The global read data bus GRD<3> and the ground voltage VSS are connected to respective gates of the PMOS transistors PM5 and PM6. The global read data bus GRD<0> and a buffering compress mode signal CPMBF obtained by sequentially inverting the compress mode signal CPM by inverters INV35 and INV36 are connected to respective gates of the PMOS transistors PM7 and PM8. The global read data bus GRD<2> and the buffering compress mode signal CPMBF are connected to respective gates of the PMOS transistors PM9 and PM10. The inversion global read data bus /GRD<0> and a compress mode signal /CPM obtained by inverting the compress mode signal CPM by the inverter INV35 are connected to respective gates of the PMOS transistors PM11 and PM12. The inversion global read data bus /GRD<2> and the compress mode signal /CPM obtained by inverting the compress mode signal CPM by the inverter INV35 are connected to respective gates of the PMOS transistors PM13 and PM14.

In addition, the inversion global read data bus /GRD<1> and the ground voltage VSS are connected to respective gates of the PMOS transistors PM15 and PM16. The inversion global read data bus /GRD<3> and the ground voltage VSS are connected to respective gates of the PMOS transistors PM17 and PM18. The inversion global read data bus /GRD<0> and the buffering compress mode signal CPMBF obtained by sequentially inverting the compress mode signal CPM by the inverters INV35 and INV36 are connected to respective gates of the PMOS transistors PM19 and PM20. The inversion global read data bus /GRD<2> and the buffering compress mode signal CPMBF are connected to respective gates of the PMOS transistors PM21 and PM22. The global read data bus GRD<0> and the compress mode signal /CPM obtained by inverting the compress mode signal CPM by the inverter INV35 are connected to respective gates of the PMOS transistors PM23 and PM24. The global read data bus GRD<2> and the compress mode signal /CPM obtained by inverting the compress mode signal CPM by the inverter INV35 are connected to respective gates of the PMOS transistors PM25 and PM26.

Accordingly, the read compressor 51 of the output unit 50 reads the test data and performs the test. At this time, the read compressor 51 determines whether the comparison data must be all identical or the adjacent data must be different according to the inverted signal /CMP and the sequentially-inverted signal CPMBF of the compress mode signal CMP. That is, when the buffering compress mode signal CPMBF has a low level, the read compressor 51 determines pass or fail by testing the same data. When the inverted compress mode signal /CPM has a low level, the read compressor 51 re-inverts and reads the inverted write data, tests the test data and determines pass or fail.

When the buffering compress mode signal CPMBF has a low level, the global read data buses GRD<0:3> are compared. When the inverted compress mode signal /CPM has a low level, the data transmitted to the global read data buses GRD<1> and GRD<3> and the inversion global data buses /GRD<0> and /GRD<2> are tested.

In the normal mode, the compress signal CP has a low level. Here, the compress mode signal CPM can have any level. Because the compress signal CP has a low level, the special test mode decoder 30 outputs the same compress signal CPS and the different compress signal CPC at a low level, regardless of the compress mode signal CPM.

Because the compress signal CP, the same compress signal CPS and the different compress signal CPC have a low level, the write compressor 42 of the input unit 40 decodes the data DIN<0:3> input when the transmission gates TG1, TG3, TG5 and TG8 are turned on and then transmits the decoded data to the global write data buses GWD<0:15>.

The output unit 50 transmits the data applied to the global read data buses GRD<0:15> to the I/O data pins DQ<0:3> by the output driver unit 53 through the multiplexer unit 52 instead of transmitting the data to the read compressor 51.

On the other hand, the compress signal CP has a high level in the test mode (i.e., the compress mode). The compress mode signal CPM has a low level in the same compress mode and a high level in the different compress mode.

In the same compress mode, the compress signal has a high level and the same compress mode signal CPS has a high level in the write compressor 42 of the input unit 40. Therefore, the transmission gates TG1, TG3, TG6 and TG8 are turned on, thereby transmitting the same data DIN<0> to the adjacent global write data buses GWD<0:3>.

The output unit 50 transmits the data applied to the global read data buses GRD<0:15> to the read compressor 51. Since the compress signal CP has a high level and the compress mode signal CPM has a low level, the inverted compress mode signal /CPM has a high level and the buffering compress mode signal CPMBF has a low level. Accordingly, the PMOS transistors PM1 and PM2 are turned on to apply the power voltage VDD, thereby turning on the PMOS transistors PM4, PM6, PM8 and PM10. As a result, the read compressor 51 compares data levels of the global read data buses GRD<0:15> connected to the gates of the PMOS transistors PM3, PM5, PM7 and PM9. That is, the read compressor 51 tests the same data to determine pass or fail.

In the different compress mode, because the compress signal CP has a high level and the different compress mode signal CPC has a high level, the transmission gates TG2, TG4, TG7 and TG9 of the write compressor 42 of the input unit 40 are turned on and, thus, the different data are transmitted to the adjacent global write data buses GWD<0:15>.

In the test mode, the output unit 50 transmits the data applied to the global read data buses GRD<0:15> to the read compressor 51. Because the compress signal CP has a high level and the compress mode signal CPM has a high level, the inverted compress mode signal /CPM has a low level and the buffering compress mode signal CPMBF has a high level. Therefore, the PMOS transistors PM1 and PM2 are turned on to apply the power voltage VDD, thereby turning on the PMOS transistors PM4, PM6, PM12 and PM14. Accordingly, the read compressor 51 compares data levels of the global read data buses GRD<0> and GRD<2> and the inversion global read data buses /GRD<1> and /GRD<3> connected to the gates of the PMOS transistors PM3, PM5, PM11 and PM13. That is, the read compressor 51 re-inverts the inverted write data, tests the test data and determine pass or fail.

Thus, the number of the I/O data pins and the test time can be reduced by using the device for transmitting the different data to the adjacent compressed global write data buses GWD<0:15> and the device for comparing the different data applied to the adjacent global read data buses GRD<0:15>.

As the present invention may be embodied in several forms without departing from the spirit or essential characteristics thereof, it should also be understood that the above-described embodiment is not limited by any of the details of the foregoing description but, rather, should be construed broadly within its spirit and scope as defined in the appended claims. Thus, all changes and modifications that fall within the metes and bounds of the claims, or equivalences of such metes and bounds are therefore intended to be embraced by the appended claims.

What is claimed is:

1. An I/O compression circuit for a semiconductor memory device, comprising:
    a command decoder adapted to combine external control signals and output a test mode command;
    a test mode control unit adapted to generate a compress signal for controlling a compress operation and a compress mode signal for distinguishing a first compress mode in which identical data are transmitted to data transmission lines from second compress mode in which different data are transmitted to adjacent data transmission lines according to the test mode command and addresses;
    a mode decoder adapted to decode the compress signal and the compress mode signal and to output a same compress signal for controlling the compress operation in a first compress mode and a different compress signal for controlling the compress operation in the second data compress mode;
    an input unit adapted to decode input data input inputted via I/O data pins, transmit the input data to data transmission lines in a normal mode, transmit the same data inputted via the I/O data pins to the data transmission lines in the first compress mode and alternately invert the input data to transmit different data to the adjacent data transmission lines in the second compress mode based on the compress signal, the same compress signal and the different compress signal; and
    an output unit adapted to drive the data transmitted through the data transmission lines and output the data to the I/O data pins in the normal mode, test the data transmitted through the data transmission lines in the first compress mode according to the compress signal and the compress mode signal, and re-invert the inverted data among the data transmitted through the data transmission lines, and test the data in the second compress mode.

2. The circuit according to claim 1, wherein the test mode control unit comprises:
    a compress signal generating unit adapted to generate the compress signal to control the compress operation according to the test mode command and the addresses; and
    a compress mode signal generating unit adapted to output the compress mode signal to distinguish the first compress mode from the second compress mode according to the test mode command and the addresses.

3. The circuit according to claim 2, wherein the compress signal generating unit further comprises a logic circuit adapted to logically combine the test mode command and the addresses and to generate the compress signal.

4. The circuit according to claim 3, wherein the logic circuit comprises:
    a first NAND gate for NANDing the addresses;
    a second NAND gate for NANDing the output signal from the first NAND gate and an inverted signal of the compress signal by a first inverter;
    a third NAND gate for NANDing the output signal from the second NAND gate and the test mode command; and
    a second inverter for inverting the output signal from the third NAND gate and outputting the compress signal.

5. The circuit according to claim 2, wherein the compress mode signal generating unit further comprises a logic circuit adapted to logically combine the test mode command and the addresses and to generate the compress mode signal.

6. The circuit according to claim 5, wherein the logic circuit comprises:
    a first NAND gate for NANDing an inverted signal of the most significant address among the addresses;
    a second NAND gate for NANDing the output signal from the first NAND gate and an inverted signal of the compress mode signal by a first inverter;
    a third NAND gate for NANDing the output signal from the second NAND gate and the test mode command; and
    a second inverter for inverting the output signal from the third NAND gate and outputting the compress mode signal.

7. The circuit according to claim 1, wherein the mode decoder comprises:
    first and second inverters for sequentially inverting the compress mode signal;
    third and fourth inverters for sequentially inverting the compress signal;
    a first NAND gate for NANDing the output signal from the first inverter and the output signal from the fourth inverter;
    a fifth inverter for inverting the output signal from the first NAND gate and outputting the same compress signal;
    a second NAND gate for NANDing the output signal from the second inverter and the output signal from the fourth inverter; and
    a sixth inverter for inverting the output signal from the second NAND gate and outputting the different compress signal.

8. The circuit according to claim 1, wherein the input unit comprises a write compressor adapted to transmit the data inputted via the I/O data pins to the data transmission lines in the normal mode, to transmit test data inputted via the I/O data pins to all the data transmission lines in the first compress mode, and to invert the test data alternately to the adjacent data transmission lines in the second data compress mode.

9. The circuit according to claim 8, wherein the write compressor comprises:
   a plurality of normal transmission units adapted to transmit the data inputted via the I/O data pins to the data transmission lines according to the compress signal in the normal mode;
   a plurality of same compress transmission units adapted to transmit the test data inputted via the I/O data pins to the whole data transmission lines according to the same compress signal in the first compress mode; and
   a plurality of different compress transmission units adapted to alternately invert the test data inputted via the I/O data pins to transmit different data to the adjacent data transmission lines according to the different compress signal in the second compress mode.

10. The circuit according to claim 1, wherein the output unit comprises:
    an output driving unit adapted to drive the data transmitted through the data transmission lines, and to output the data to the I/O data pins in the normal mode; and
    a read compressor adapted to test the data transmitted through the data transmission lines in the first compress mode and to re-invert inverted data among the data transmitted through the data transmission lines and test the data in the second compress mode.

11. The circuit according to claim 10, wherein the read compressor comprises:
    a same data test unit adapted to test the data transmitted through the data transmission lines according to the same compress signal in the first compress mode; and
    a different data test unit adapted to re-invert the inverted data among the data transmitted through the data transmission lines and test the data according to the different compress signal in the second compress mode.

* * * * *